(12) United States Patent
Kim

(10) Patent No.: US 8,722,438 B2
(45) Date of Patent: May 13, 2014

(54) METHOD OF MANUFACTURING A DISPLAY SUBSTRATE

(75) Inventor: Jin-Yup Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 107 days.

(21) Appl. No.: 13/312,549

(22) Filed: Dec. 6, 2011

(65) Prior Publication Data
US 2013/0023078 A1    Jan. 24, 2013

(30) Foreign Application Priority Data

Jul. 20, 2011 (KR) .................. 10-2011-0071873

(51) Int. Cl.
*H01L 21/00* (2006.01)

(52) U.S. Cl.
USPC .................. 438/29; 438/30; 438/33

(58) Field of Classification Search
USPC ........ 438/29, 30, 33; 349/129, 141, 110, 123, 349/56
See application file for complete search history.

(56) References Cited

U.S. PATENT DOCUMENTS

| | | | |
|---|---|---|---|
| 6,933,568 B2 * | 8/2005 | Yang et al. | 257/347 |
| 2001/0026342 A1 * | 10/2001 | Ejiri et al. | 349/139 |
| 2008/0203392 A1 * | 8/2008 | Kim et al. | 257/59 |
| 2009/0008646 A1 * | 1/2009 | Kim et al. | 257/59 |
| 2009/0142867 A1 * | 6/2009 | Fujikawa et al. | 438/30 |

FOREIGN PATENT DOCUMENTS

| | | |
|---|---|---|
| KR | 10-0429486 B1 | 4/2004 |
| KR | 10-2007-0088886 A | 8/2007 |
| KR | 10-2008-0021863 A | 3/2008 |

* cited by examiner

*Primary Examiner* — George Fourson, III
*Assistant Examiner* — Wilner Jean Baptiste
(74) *Attorney, Agent, or Firm* — Knobbe, Martens, Olson & Bear, LLP

(57) ABSTRACT

A method of manufacturing a display substrate is disclosed. In one embodiment, an electrode layer may be formed on a base substrate including a first cell area, a second cell area and an intervening area between the first and the second cell areas. First electrodes may be formed in display regions of the first and the second cell areas by patterning the electrode layer. The electrode layer in an intervening area may be removed. Source electrodes and drain electrodes of thin film transistor may be formed in the first and the second cell areas where the first electrodes are formed.

18 Claims, 8 Drawing Sheets

METHOD OF MANUFACTURING A DISPLAY SUBSTRATE

CROSS REFERENCE TO RELATED APPLICATION

This application claims priority under 35 U.S.C. §119 to Korean patent Application No. 10-2011-0071873 filed on Jul. 20, 2011, the disclosure of which is hereby incorporated by reference herein in its entirety.

BACKGROUND

1. Technical Field

The described technology generally relates to a method of manufacturing a display substrate.

2. Description of the Related Technology

Generally, a display device has a matrix of pixels formed on a display substrate. Each substrate pixel includes signal lines, a thin film transistor (TFT) coupled to the signal lines and a pixel electrode connected to the TFT. In manufacturing the display substrate, the TFT is formed on a substrate, and a protection layer having a contact hole partially exposing the TFT is formed on the substrate. Then, the pixel electrode is formed on the protection layer to be electrically connected to the TFT.

A pixel of the display substrate may be defined by the pixel electrode, and light transmittance of a display device may be changed by increasing the area defined by the pixel electrode. Furthermore, light transmittance may be reduced by increasing the area of each storage electrode. To improve the transmittance of the display device, the storage electrode including a transparent material may be provided on the display substrate. For example, a storage line and the storage electrode of the transparent material connected to the storage line may be formed on a base substrate before forming a gate insulation layer on the base substrate. Thus, the region that blocks light due to the storage line and the storage electrode will be minimized while ensuring the necessary capacitance of each storage capacitor.

SUMMARY

One inventive aspect is a method of manufacturing a display substrate including a signal line and a thin film transistor ensuring improved reliabilities and enhanced electrical characteristics.

Another aspect is a method of manufacturing a display substrate. In the method of manufacturing the display substrate, an electrode layer may be formed on a base substrate including a first cell area, an intervening area and a second cell area spaced apart from the first cell area. First electrodes may be formed in display regions of the first and the second cell areas by patterning the electrode layer. The electrode layer in the intervening area may be removed. Source electrodes and drain electrodes of thin film transistors may be formed in the first and the second cell areas where the first electrodes may be formed. Each of the source electrodes may be separated from each drain electrode.

In example embodiments, a first insulation layer and a semiconductor layer may be additionally formed over the base substrate having the first electrodes before forming the source and the drain electrodes. The first insulation layer and the semiconductor layer may be patterned to expose the base substrate in the intervening area. Active patterns may be formed beneath the source and the drain electrodes. The source electrodes and the drain electrodes may be positioned between the first electrodes and the active patterns.

In example embodiments, a first photoresist pattern may be formed on the semiconductor layer in the display regions of the first and the second cell areas. The first photoresist pattern may include a first portion and a second portion substantially thinner than the first portion. A second photoresist pattern may be formed in a peripheral region substantially surrounding the display region of the first cell area. The second photoresist pattern may have a thickness substantially the same or substantially similar to that of the second portion. A third photoresist pattern may be formed in a peripheral region substantially surrounding the display region of the second cell area. The third photoresist pattern may have a thickness substantially the same as or substantially similar to that of the second photoresist pattern. The third photoresist pattern may be spaced apart from the second photoresist pattern. The first insulation layer and the semiconductor layer may be partially etched by a first etching process using the first, the second and the third photoresist patterns as etching masks. The second portion, the second photoresist pattern and the third photoresist pattern may be removed to form a remaining pattern. The semiconductor layer may be partially etched by a second etching process using the remaining pattern as an etching mask to provide the active patterns.

In example embodiments, the semiconductor layer in the intervening area may be exposed by the second and the third photoresist patterns. The semiconductor layer and the first insulation layer may be removed to expose the base substrate in the intervening area in the first etching process.

In example embodiments, the semiconductor layer exposed by the remaining pattern may be removed to expose the first insulation layer in the second etching process.

In example embodiments, gate electrodes of the thin film transistors and storage lines spaced apart from the gate electrodes may be formed over the base substrate in the first and the second cell areas before forming the electrode layer.

In example embodiments, the first electrodes may include storage electrodes directly contacting the storage lines.

In example embodiments, second electrodes contacting the drain electrodes and overlapping relative to the first electrodes may be additionally formed after forming the source and the drain electrodes.

In example embodiments, a second insulation layer may be additionally formed over the base substrate having the source and the drain electrodes before forming the second electrodes. The second insulation layer may be partially etched to at least partially expose the drain electrodes.

In example embodiments, the base substrate may be cut along the intervening area.

Another aspect is a method of manufacturing a display substrate. In the method of manufacturing the display substrate, a first electrode layer may be formed on a base substrate including a first cell area, a second cell area, and an intervening area between the first and the second cell areas. First electrodes may be formed in display regions of the first and the second cell areas by patterning the first electrode layer. Electrode patterns may be formed in the intervening area and in peripheral regions substantially surrounding the display regions of the first and the second cell areas. An insulation layer and a semiconductor layer may be formed over the base substrate having the first electrodes and the electrode patterns. A first photoresist pattern may be formed on the semiconductor layer in of the first and the second cell regions. The first photoresist pattern may include a first portion and a second portion substantially thinner than the first portion. A second photoresist pattern may be formed in the peripheral regions and the intervening area. The second photoresist patter may have a thickness substantially the same as or substantially similar to that of the second portion. Active patterns of thin film transistors may be formed by patterning the first insulation layer and the semiconductor layer using the first and the second photoresist patterns as etching masks. Source electrodes and drain electrodes of the thin film transistors may be formed in the first and the second cell areas over the base substrate having the active patterns. Each of the drain electrodes may be spaced apart from each of the source electrodes.

In example embodiments, the first insulation layer and the semiconductor layer may be patterned by a first etching process using the first and the second photoresist patterns as etching masks. The second portion may be removed to form a remaining pattern. The semiconductor layer exposed by the remaining pattern may be patterned by a second etching process to provide the active patterns.

In example embodiments, gate electrodes of the thin film transistors and storage lines spaced apart from the gate electrodes may be additionally formed over the base substrate in the first and the second cell areas before forming the electrode layer.

In example embodiments, each of the first electrodes may include a storage electrode directly contacting each of the storage lines.

In example embodiments, second electrodes contacting the drain electrodes and substantially overlapping relative to the first electrodes may be additionally formed after forming the source electrodes and the drain electrodes.

In example embodiments, a second insulation layer may be additionally formed over the base substrate having the source and the drain electrodes before forming the second electrodes. The second insulation layer may be partially etched to expose the drain electrodes.

In example embodiments, the base substrate may be cut along the intervening area.

DETAILED DESCRIPTION OF EMBODIMENTS

Figure 1:
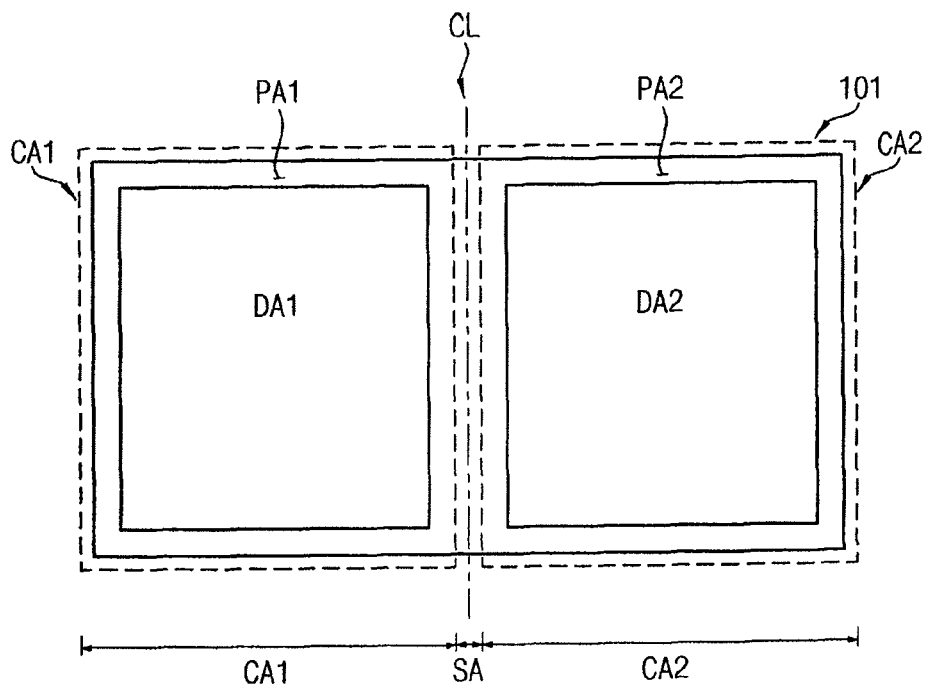
FIG. 1 is a plan view illustrating a mother substrate manufactured by a method of manufacturing a display substrate in accordance with example embodiments.

When an active pattern and an insulation layer are formed at a peripheral portion of a display region of a base substrate using a single mask, a pattern having a structure the same as that of a storage electrode may remain at the peripheral portion to be exposed. In case that a thin film transistor (TFT) is formed on the base substrate having the exposed pattern, the exposed pattern may contact a gas and/or a solution employed in processes for forming the TFT on the base substrate. The pattern exposed to the gas and/or the solution may be easily deteriorated, and a metal layer for forming electrodes of the TFT may be also deteriorated when the metal layer is formed on the deteriorated pattern at the peripheral portion of the display region. Therefore, electrical characteristics and a reliability of TFT may be reduced because of the electrodes of the TFT is formed by the patterning the deteriorated metal layer.

Embodiments are described more fully hereinafter with reference to the accompanying drawings. However, the disclosed embodiments are not considered limiting. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of certain embodiments (and related structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and may exaggerate the actual shape of a region of a device.

Unless otherwise defined, all terms (including technical and scientific terms) used herein have the same meaning as commonly understood by one of ordinary skill in the flat panel display technology It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
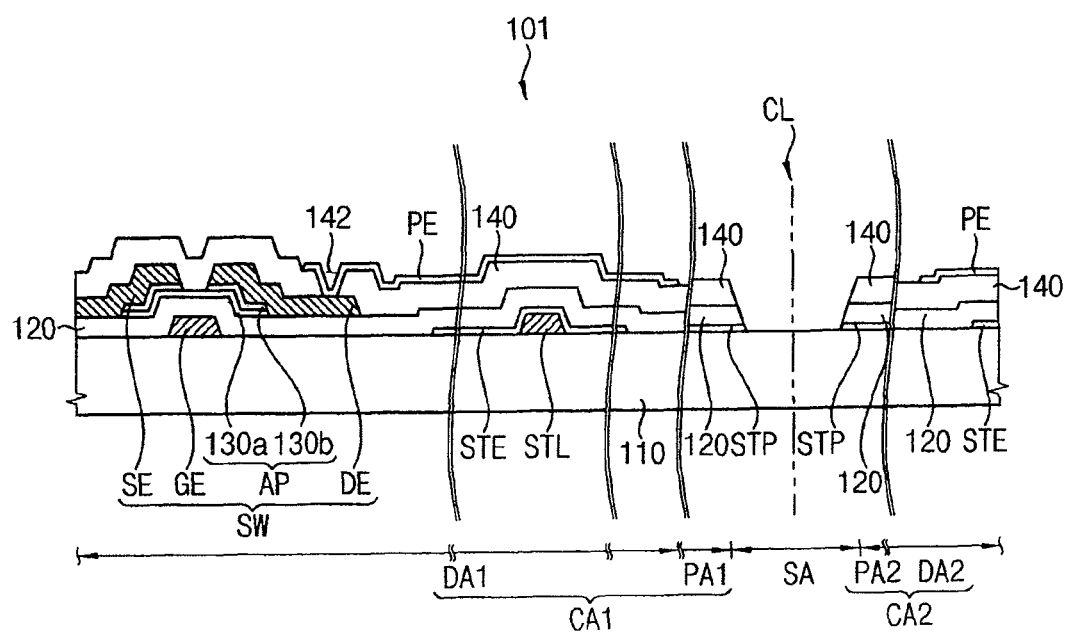
FIG. 2 is a cross-sectional view illustrating a mother substrate by a method of manufacturing a display substrate in accordance with example embodiments.

FIG. 1 is a plan view illustrating a mother substrate manufactured by a method of manufacturing a display substrate in accordance with example embodiments. FIG. 2 is a partial cross-sectional view illustrating a mother substrate obtained by a method of manufacturing a display substrate in accordance with example embodiments.

Referring to FIG. 1 and FIG. 2, a mother substrate 101 by the method of manufacturing the display substrate may include a base substrate 110 having a first cell area CA1, a second cell area CA2 and an intervening area SA.

The first cell area CA1 may include a first display region DA1 and a first peripheral region PA1. The first display region DA1 may include a plurality of pixels. The first peripheral region PA1 may be disposed at an outside of the first display region DA1. For example, the first peripheral region PA1 may substantially surround the first display region DA1. The first peripheral region PA1 may substantially correspond to an edge portion of the first cell area CA1. The second cell area CA2 may include a second display region DA2 and a second peripheral region PA2. The second display region DA2 may also include a plurality of pixels. The second peripheral region PA2 may be disposed at an outside of the second display region DA2. For example, the second peripheral region PA2 may substantially surround the second display region DA2. The second peripheral region PA2 may substantially correspond to an edge portion of the second cell area CA2.

The second cell area CA2 may have a construction substantially the same as or substantially similar to that of the first cell area CA1, except for a position of the second cell area CA2 on the mother substrate 101 with respect to the intervening area SA. Hereinafter, the relationship between the first and the second cell areas CA1 and CA2 based on the construction of the first cell areas CA1 will be described, and thus repeated descriptions of the second cell area CA2 will be omitted.

Each of the pixels of the first and the second display regions DA1 and DA2 may include a thin film transistor SW as a switching device and a pixel electrode PE electrically coupled to the thin film transistor SW. Each of the pixels may be electrically coupled to signal lines through the thin film transistor SW. The thin film transistor SW may include a gate electrode GE, an active pattern AP, a source electrode SE and a drain electrode DE. The gate electrode GE may be electrically connected to a first signal line (not illustrated) for applying a gate signal to the gate electrode GE. The source electrode SE may be electrically coupled to a second signal line (not illustrated) for applying a data signal to the source electrode SE. The first and the second signal lines may substantially perpendicular to each other. The active pattern AP may include a semiconductor layer 130a and an ohmic contact layer 130b.

The gate electrode GE may be disposed on the base substrate 110, and the active pattern AP may be positioned over the gate electrode GE. Both edge portions of the active pattern AP may be located beneath the source electrode SE and the drain electrode DE, respectively. The active pattern AP may be insulated from the gate electrode GE by a first insulation layer 120. The first insulation layer 120 may serve as a gate insulation of the thin film transistor SW. The thin film transistor SW may be covered with a second insulation layer 140. The second insulation layer 140 may include an opening 142 that partially exposes the drain electrode DE. The pixel electrode PE may be electrically coupled to the thin film transistor SW through the opening 142 of the second insulation layer 140. The pixel electrode PE may at least partially contact an upper face of the drain electrode DE in the opening 142.

Each of the pixels in the first and the second display regions DA1 and DA2 may additionally include a storage line STL and a storage electrode STE contacting the storage line STL provided on the base substrate 110. The storage line STL may be spaced apart from the gate electrode GE by a predetermined distance. The storage line STL may extend in a direction substantially parallel to the first signal line for applying the gage signal. The storage electrode STE may directly contact the upper face of the storage line STL. The storage electrode STE may partially or substantially entirely overlap with the pixel electrode PE by interposing the first and the second insulation layers 120 and 140 therebetween. The storage electrode STE may be electrically insulated from the pixel electrode PE by the first and the second insulation layers 120 and 140. That is, the first and the second insulation layers 120 and 140 may be sequentially disposed between the storage electrode STE and the pixel electrode PE. Alternatively, one of the first and the second insulation layers 120 and 140 may be positioned between the storage electrode STE and the pixel electrode PE. The storage electrode STE may substantially overlap with the pixel electrodes PE by interposing the first and the second insulation layers 120 and 140 to thereby provide a storage capacitor having the first and the second insulation layers 120 and 140 as a dielectric layer thereof.

Electrode patterns STP may be disposed in the first and the second peripheral regions PA1 and PA2, respectively. Each of the electrode patterns STP may include a layer substantially the same as or substantially similar to that of the storage electrode STE. Each of the electrode patterns STP may be electrically separated from the pixel, or be electrically coupled to each pixel. Further, each of the electrode patterns STP may be spaced apart from each other by interposing the intervening area SA therebetween. The electrode patterns STP may be covered with at least one of the first and the second insulation layers 120 and 140.

The intervening area SA may be positioned between the first and the second peripheral regions PA1 and PA2. Since a remaining pattern including a layer substantially the same as or substantially similar to that of each electrode pattern STP may not locate in the intervening area SA, the base substrate 110 may be partially exposed. When the remaining pattern is not provided in the intervening area SA to thereby expose a portion of the base substrate 110, deteriorations of the source electrode SE and the drain electrode DE may be prevented or considerably reduced.

In case that the remaining pattern is disposed on the base substrate 110, the remaining pattern in the intervening area SA may be exposed to a gas and/or a solution in processes performed before forming the source electrode SE and the drain electrode DE. Thus, characteristics of the remaining pattern may be deteriorated. Additionally, when a metal layer is formed on the remaining pattern to form the source electrode SE and the drain electrode DE, the metal layer may be deteriorated by the deteriorated remaining pattern. However, according to example embodiments, the remaining pattern may not locate in the intervening area SA to partially expose the base substrate 110, so that the deterioration of the metal layer positioned the exposed base substrate 110 may be effectively prevented. Thus, the source electrode SE and the drain electrode DE may have improved reliabilities Furthermore, the second signal line having a construction substantially the same as or substantially similar to those of the source electrode SE and the drain electrode DE may also have an enhanced reliability.

The intervening area SA may include a virtual cutting line CL. The mother substrate 101 may be cut along the cutting line CL to obtain the first and the second cell areas CA1 and CA2, which may serve as independent display substrates.

Hereinafter, a method of manufacturing a display substrate will be described in more detail. The mother substrate 101 illustrated in FIGS. 1 and 2 may be manufactured by processes described with reference to FIGS. 3A to 3F.

FIGS. 3A to 3F are cross-sectional views to illustrate a method of manufacturing the display substrate in accordance with example embodiments.

Figure 3A:
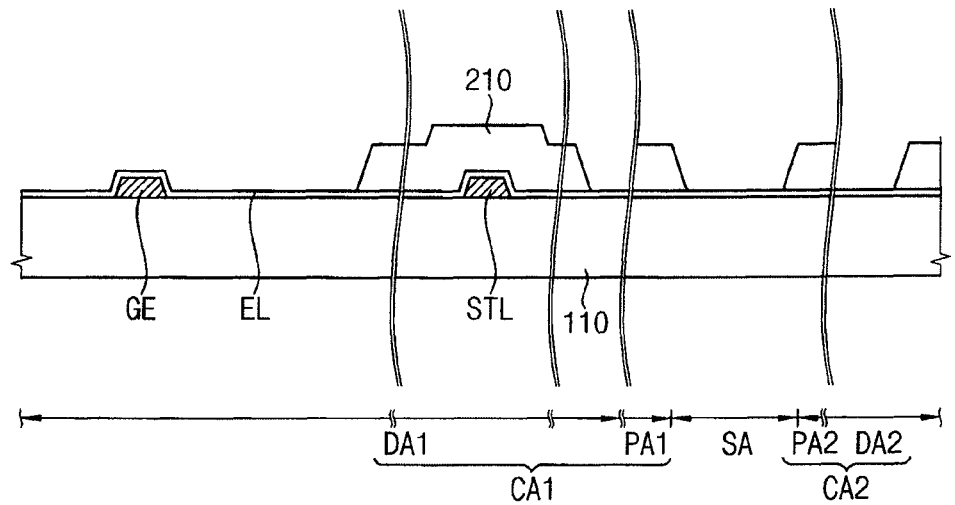
FIGS. 3A to 3F are cross-sectional views illustrating a method of manufacturing a display substrate in accordance with example embodiments.

Referring to FIG. 3A, a gate electrode GE and a storage line STL may be formed on a base substrate 110, and then a first electrode layer EL may be formed on the base substrate 110 having the gate electrode GE and the storage line STL thereon. An etch stop layer pattern 210 may be formed on the base substrate 110 on which the first electrode layer EL is formed.

In example embodiments, a first metal layer (not illustrated) may be formed on the base substrate 110, and then is the first metal layer may be patterned to obtain the gate electrode GE and the storage line STL spaced apart from the gate electrode GE. For example, the first metal layer may be patterned by a photolithography process or an etching process using an additional mask.

The first electrode layer EL may be formed on an entire face of the base substrate 110 having the gate electrode GE thereon. The first electrode layer EL may be positioned in a first cell area CA1, a second cell area CA2, and an intervening area SA between the first and the second cell areas CA1 and CA2. The first electrode layer EL may be formed using a transparent conductive material. For example, the first electrode layer EL may be formed using indium tin oxide (ITO), indium zinc oxide (IZO), etc.

The first coating layer (not illustrated) may be formed on substantially the entire face of the base substrate 110 having the first electrode layer EL thereon, and then the first coating layer may be exposed and developed to obtain an etch stop layer pattern 210. When the first coating layer is exposed to light, the first coating layer positioned in the first and the second cell areas CA1 and CA2 may be exposed to light, and then the first coating layer located in the intervening area SA may be exposed to light. That is, the first coating layer disposed in the intervening area SA may be additionally exposed to light. The first coating layer may be formed using a photoresist composition. The etch stop layer pattern 210 may be formed at portions of the base substrate 110 where a storage electrode STE and electrode patterns STP will be formed. For example, the etch stop layer pattern 210 may expose a portion of the first electrode layer EL located in the intervening area SA.

The first electrode layer EL may be partially etched using the etch stop layer pattern 210 as an etching mask, and then the etch stop layer pattern 210 may be removed from the patterned first electrode layer EL. The first electrode layer EL may be patterned to form the storage electrode STE as the first electrode and the electrode patterns STP on the base substrate 110.

In some example embodiments, the gate electrode GE and the storage line STL may be formed on the base substrate 110 after formations of the storage electrode STE and the electrode patterns STP. For example, the first metal layer may be formed on the base substrate 110 having the storage electrode STE and the electrode patterns STP thereon. Thereafter, the first metal layer may be patterned to obtain the gate electrode GE separated from the storage electrode STE and the storage line STL disposed on the storage electrode STE.

Figure 3B:
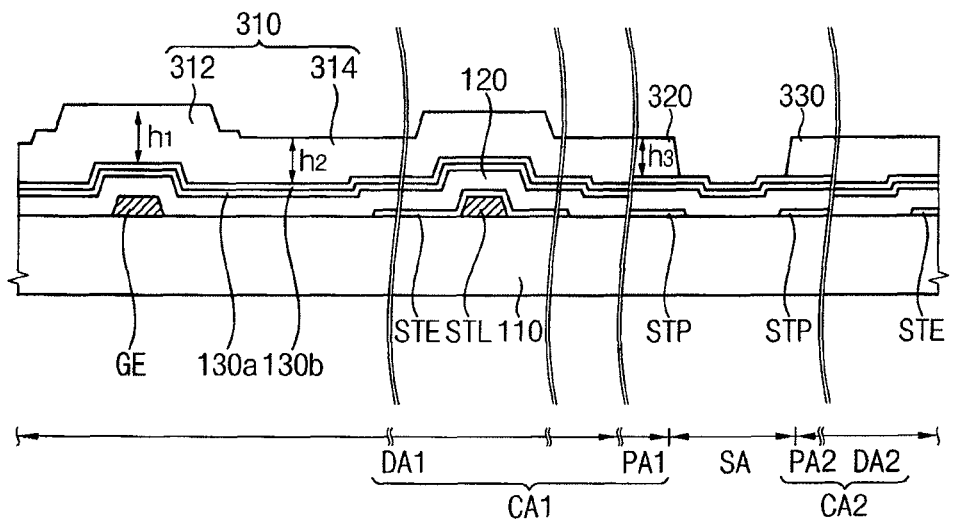

Referring to FIG. 3B, the first electrode layer EL may be partially etched to provide the storage electrode STE and the electrode patterns STP on the base substrate 110. The storage electrode STE may be spaced apart from the gate electrode GE and may directly contact an upper face of the storage line STL. The storage electrode STE may cover the storage line STL. The electrode patterns STP may be separated from each other by the intervening area SA, so that the base substrate 110 in the intervening area SA may be exposed between the electrode patterns STP.

A first insulation layer 120, a semiconductor layer 130a and an ohmic contact layer 130b may be sequentially formed on the base substrate 110 on which the gate electrode GE, the storage electrode STE and the electrode patterns STP are formed. The semiconductor layer 130a and the ohmic contact layer 130b may substantially entirety cover the base substrate 110 having the resultant structure.

A first photoresist pattern 310, a second photoresist pattern 320 and a third photoresist pattern 330 may be formed on the ohmic contact layer 130b. For example, the first to the third photoresist patterns 310, 320 and 330 may be obtained by a photo process using a half tone mask or a half tone slit mask. The first photoresist pattern 310 may include a first portion 312 and a second portion 314 having different thicknesses. The first portion 312 may have a first thickness h1, and the second portion 314 may have a second thickness h2 substantially less than the first thickness h1. The first portion 312 may be disposed at a portion of the ohmic contact layer 130b where an active pattern AP will be formed. The second portion 314 may be located in a first display region DA 1 of the first cell area CA1 and a second display region DA2 of the second cell area CA2.

The second photoresist pattern 320 may be formed in a first peripheral region PA1 of the first cell area CA1. The second photoresist pattern 320 may have a third thickness h3 substantially the same as or substantially similar to the second thickness h2 of the second portion 314 of the first photoresist pattern 310. The third photoresist pattern 330 may be positioned in a second peripheral region PA2 of the second cell area CA2. The third photoresist pattern 330 may be spaced apart from the second photoresist pattern 320. The third photoresist pattern 330 may have a thickness substantially the same as or substantially similar to the third thickness h3 of the second photoresist pattern 320.

In example embodiments, a second coating layer (not illustrated) may be formed on the base substrate 110 to cover the ohmic contact layer 130b. The second coating layer may be exposed and developed to form the photoresist patterns 310-330 on the ohmic contact layer 130b. The second coating layer may be formed using a photoresist composition. The first and the second portions 312 and 314 of the first photoresist pattern 310 may have different thicknesses from each other by controlling intensities of light irradiated onto the second coating layer.

When the second coating layer is formed using a positive photoresist composition of which a portion exposed to light is removed in a developing process and an intensity of light irradiated onto a the first portion of the first photoresist pattern 310 is about "0," an intensities of light irradiated onto the second portion of the first photoresist 310, and the second and the third photoresist patterns 320 and 330 may be substantially greater than about "0" whereas substantially less than about "1". Here, intensities of light irradiated onto other portions of the second coating layer except for the three photoresist patterns 310-330 may be about "1".

The ohmic contact layer 130b, the semiconductor layer 130a and the first insulation layer 120 may partially be etched by a first etching process using the photoresist patterns 310-330 as etching masks. Therefore, the base substrate 110 may be exposed in the intervening area SA. Portions of the ohmic contact layer 130b, the semiconductor layer 130a and the first insulation layer 120 beneath the first, the second and the third photoresist patterns 310, 320 and 330 may remain on the base substrate 110 because the portions of the ohmic contact layer 130b, the semiconductor layer 130a and the first insulation layer 120 may be covered with the first, the second and the third photoresist patterns 310, 320 and 330.

Figure 3C:
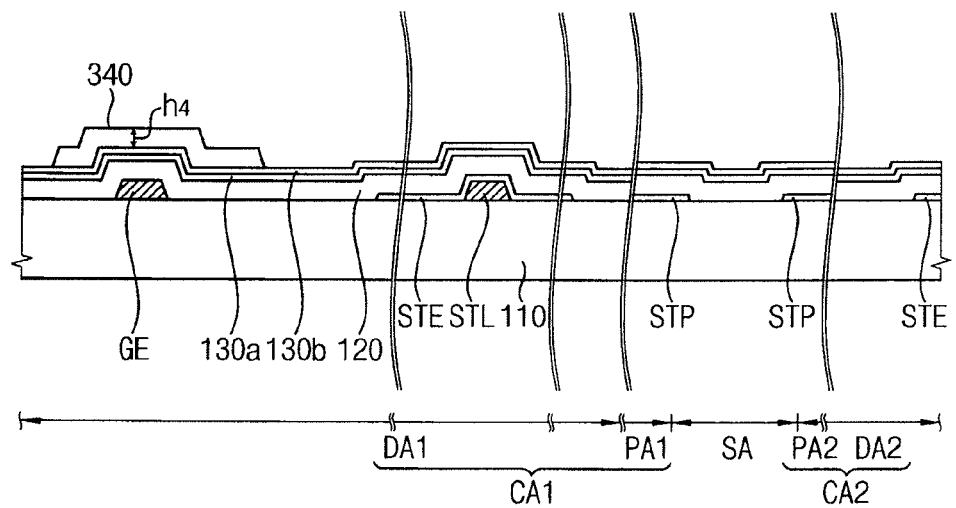

Referring to FIG. 3C, an etch-back process may be performed about the first, the second and the third photoresist patterns 310, 320 and 330 while partially exposing the base substrate 110 in the intervening area SA, so that a remaining pattern 340 may be formed on the base substrate 110. The etch-back process may include an ashing process for removing the first, the second and the third photoresist patterns 310, 320 and 330. An etching end point of the etch-back process may substantially correspond to the second thickness h2 of the first photoresist pattern 310. Therefore, the second portion 314 of the first photoresist pattern 310, and the second and the third photoresist patterns 320 and 330 may be removed from the ohmic contact layer 130b by the etch-back process. However, the first portion 312 of the first photoresist pattern 310 may partially remain on the ohmic contact layer 130b. The first thickness portion 312 is substantially larger than the second thickness h2, so that the remaining portion of the first photoresist pattern 310 may be changed to the remaining pattern 340 having a fourth thickness h4. Other portions of the ohmic contact layer 130b may be exposed except a portion of the ohmic contact pattern 130b covered with the remaining pattern 340 positioned over the gate electrode GE.

The first electrode layer EL in the intervening area SA may be removed in pattering of the first electrode layer EL, areas of the electrode patterns STP exposed to gases and/or solutions may be minimized even though the electrode patterns STP in the intervening area SA may be exposed to the gases and/or the solutions in the etch-back process.

Figure 3D:
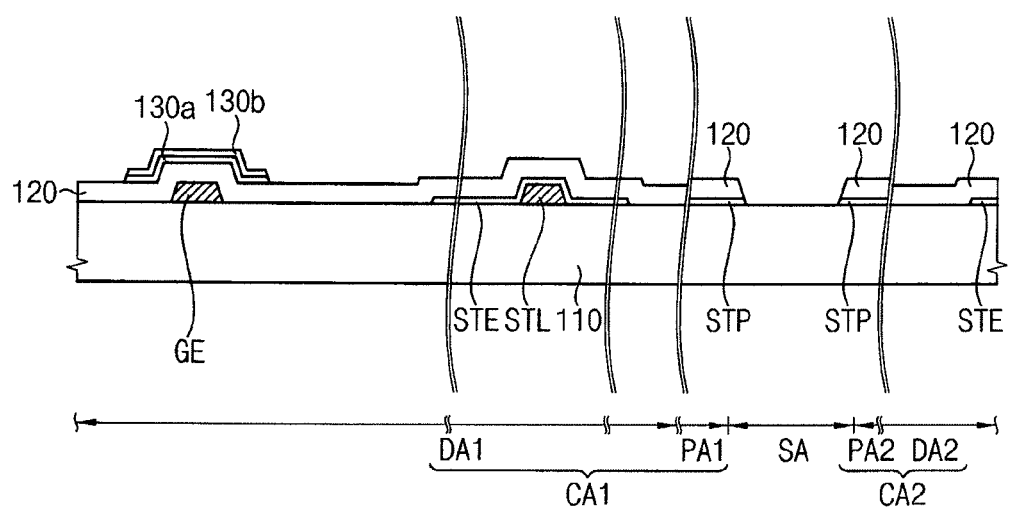

Referring to FIG. 3D, the ohmic contact layer 130b and the semiconductor layer 130a may be partially etched by a second etching process using the remaining pattern 340 as an etch mask. Hence, an active pattern including an ohmic contact pattern 130b and a semiconductor pattern 130a may be formed on a portion of the first insulation layer 120 over the gate electrode GE whereas other portions of the first insulation layer 120 may be exposed after formation of the active pattern.

After forming of the ohmic contact pattern 130b and the semiconductor pattern 130a, the remaining pattern 340 may be removed from the ohmic contact pattern 130b. The base substrate 110 may be treated by a cleaning process after removing the remaining pattern 340 from the base substrate 110.

As described above with reference to FIGS. 3B to 3D, the first insulation layer 120, the semiconductor layer 130a and the ohmic contact layer 130b may be patterned using one mask to form the active pattern and the base substrate 110 in the intervening area SA may be exposed. Thus, processes for forming the thin film transistor may be simplified. Further, the first electrode layer EL in the intervening area SA may be removed in a process of pattering the first electrode layer EL, so that contacts of the electrode patterns STP relative to the gases and/or solutions may be minimized although the intervening area SA may be exposed to a gas and/or a solution used in the second etching process or a process of removing the remaining pattern 340.

Figure 3E:
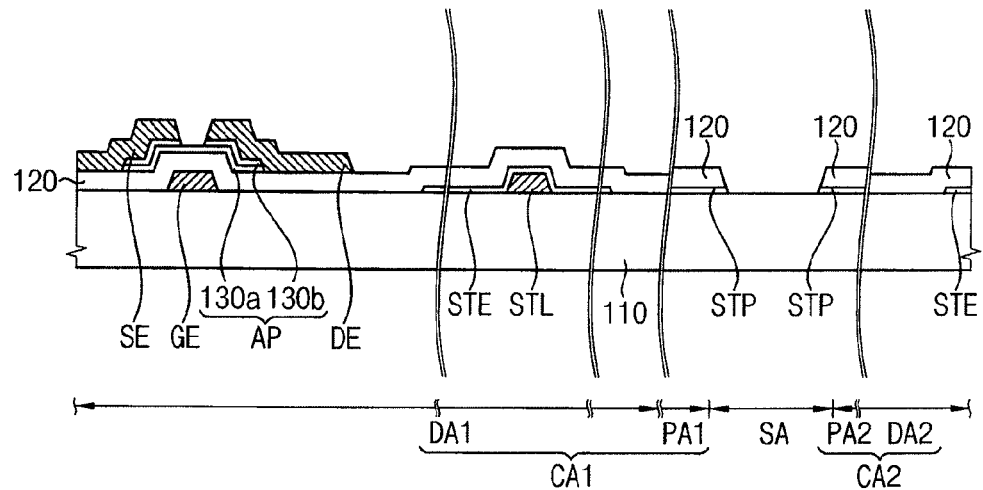

Referring to FIG. 3E, a source electrode SE and a drain electrode DE may be formed on the active pattern and the first insulation layer 120. Thus, the thin film transistor having the gate electrode GE, the source electrode SE and the drain electrode DE may be provided on the base substrate 110.

In example embodiments, a second metal layer (not illustrated) may be formed on the base substrate 110 having the active pattern thereon. The second metal layer may be patterned by a photolithography process to form the source electrode SE and the drain electrode DE on the active pattern and the first insulation layer 120. The drain electrode DE may be spaced apart from the source electrode SE by a predetermined distance, and the ohmic contact layer 130b disposed in a separate region between the source electrode SE and the drain electrode DE may be removed. Thus, the semiconductor layer 130a disposed in the separate region between the source electrode SE and the drain electrode DE is exposed.

Figure 3F:
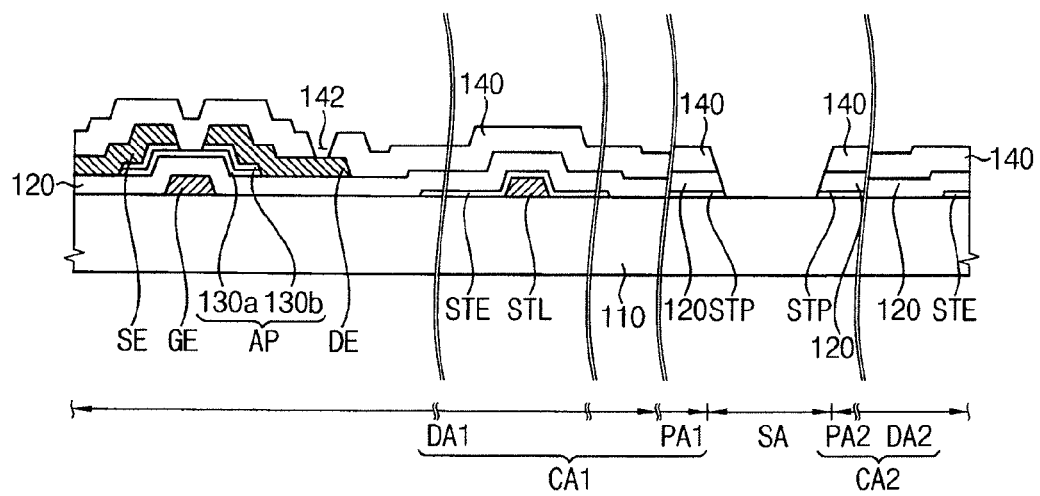

Referring to FIG. 3F, a second insulation layer 140 may be formed over the base substrate 110 having the source electrode SE and drain electrode DE. The second insulation layer 140 may be disposed in the first and the second cell areas CA1 and CA2, whereas the second insulation layer 140 may not be formed in the intervening area SA. The second insulation layer 140 may have an opening 142 partially exposing the drain electrode DE. For example, the second insulation layer 140 may be formed over an entire face of the base substrate 110, and then a portion of the second insulation layer 140 in the intervening area SA may be removed. Additionally, the second insulation layer 140 on the drain electrode DE may be partially removed. Alternatively, the second insulation layer 140 may be not formed in the intervening area SA while forming the second insulation layer 140 over the base substrate 110.

In some example embodiments, the second insulation layer 140 having the opening 142 may be formed over the entire face of the base substrate 110 to cover the intervening area SA.

A pixel electrode corresponding to a second electrode may be formed on the second insulation layer 140 having the opening 142. Accordingly, a display substrate may be obtained, which may have a construction substantially the same as or substantially similar to that of the mother substrate 101 described with reference to FIG. 2. The pixel electrode PE may contact an upper face of the drain electrode DE exposed through the opening 142 of the second insulation layer 140.

In example embodiments, a second electrode layer (not illustrated) may be formed on the second insulation layer 140 having the opening 142. The second electrode layer may be patterned using a photolithography process to obtain the pixel electrode at least partially contacting the drain electrode DE. The second electrode layer may be formed using a transparent conductive material. For example, the second electrode layer may include indium tin oxide (ITO), indium zinc oxide (IZO), etc.

As described above, the first electrode layer EL in the intervening area SA may be removed while forming the storage electrode STE and the electrode pattern STP on the active pattern. The remaining pattern 340 may effectively prevent deteriorations of the source electrode SE and the drain electrode DE because the remaining pattern 340 may prevent the source and the drain electrodes SE and DE from being exposed to the gases and/or the solutions employed in the processes of forming the thin film transistor. Therefore, the mother substrate may have an improved reliability and enhanced electrical characteristics.

Although it is not illustrated, the mother substrate may be cut along a cutting line such as the mother substrate 101 described with reference to FIGS. 1 and 2. Thus, the first and the second cell areas CA1 and CA2 may be separated by cutting the mother substrate to thereby obtain display substrates substantially corresponding to the first and the second cell areas CA1 and CA2, respectively. Accordingly, a reliability of processes of manufacturing the display substrate may be improved.

Figure 4:
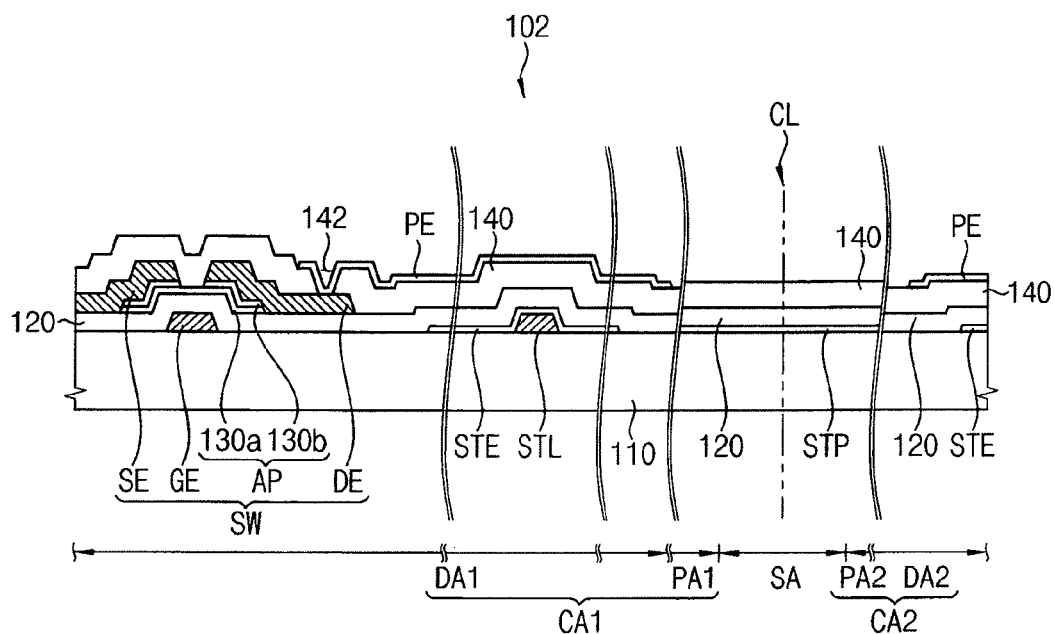
FIG. 4 is a cross-sectional view illustrating a mother substrate manufactured by a method of manufacturing a display substrate in accordance with example embodiments.

FIG. 4 is a cross-sectional view illustrating a mother substrate obtained by a method of manufacturing a display substrate in accordance with example embodiments.

A mother substrate 102 illustrated in FIG. 4 may have a construction substantially the same as or substantially similar to that of the mother substrate 101 described with reference to FIGS. 1 and 2 except for a first peripheral region PA1, an intervening area SA and a second peripheral region PA2.

Referring to FIG. 4, the mother substrate 102 may include a base substrate 110 having a first cell area CA1, a second cell area CA2 and the intervening area SA.

A thin film transistor SW serving as a switching device and a pixel electrode PE coupled to the thin film transistor SW may be disposed in each of a first display region DA1 of the first cell area CA1 and a second display region DA2 of the second cell area CA2. Additionally, a storage line STL separated from the thin film transistor SW and a storage electrode STE coupled to the storage line STL may be disposed in each of the first and the second display regions DA1 and DA2. A gate electrode GE of the thin film transistor SW may be covered with a first insulation layer 120. The thin film transistor SW may be covered with the first insulation layer 120 in the first peripheral region PA1, the second peripheral region PA2 and the intervening area SA, and may be covered with a second insulation layer 140 disposed on the first insulation layer 120. A storage electrode STE may be positioned under the pixel electrode PE. The storage electrode STE may be electrically insulated from the pixel electrode PE by the first and the second insulation layers 120 and 140.

Electrode patterns STP may be positioned in the first peripheral region PA 1, the second peripheral region PA2 and the intervening area SA. The first peripheral region PA1 may substantially correspond to an edge portion of the first cell area CA1. The first peripheral region PA1 may substantially surround the first display region DA1. The second peripheral region PA2 may substantially correspond to an edge portion of the second cell area CA2, and the second peripheral region PA2 may substantially surround the second display region DA2. Each of the electrode patterns STP may have a construction substantially the same as or substantially similar to that of the storage electrode STE. The electrode patterns STP may be covered with the first insulation layer 120 extending from the first and the second display regions DA1 and DA2 to the intervening area SA through the first and the second peripheral regions PA 1 and PA2.

The intervening area SA may include a virtual cutting line CL. Although the electrode patterns STP may be integrally formed in the first and the second peripheral regions PA1 and PA2 and the intervening area SA of the mother substrate 102, the electrode patterns STP in the first and the second cell areas CA1 and CA2 may be separated when the mother substrate 102 is cut along the cutting line CL. Additionally, the mother substrate 101 may be cut along the cutting line CL to provide two display substrates substantially corresponding to the first and the second cell areas CA1 and CA2, respectively.

Hereinafter, a method of manufacturing the display substrate illustrated in FIG. 4 will be described in more detail with reference to FIGS. 5A to 5F.

FIGS. 5A to 5F are cross-sectional views illustrating a method of manufacturing the display substrate in accordance with example embodiments.

Figure 5A:
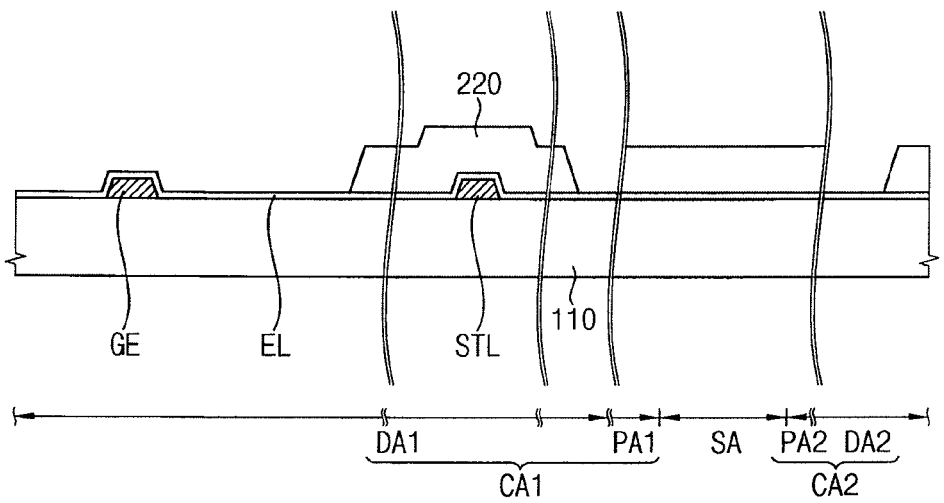
FIGS. 5A to 5F are cross-sectional views illustrating a method of manufacturing a display substrate in accordance with example embodiments.

Referring to FIG. 5A, the gate electrode GE and the storage line STL may be formed on the base substrate 110, and then a first electrode layer EL may be formed on the base substrate 110 having the gate electrode GE and the storage line STL thereon. An etch stop layer pattern 210 may be formed on the first electrode layer EL under which the storage line STL is disposed.

A first coating layer may be formed over the base substrate 110 having the first electrode layer EL, and then the first coating layer may be exposed and developed to form the etch stop layer pattern 220 on the first electrode layer EL. The etch stop layer pattern 220 may be positioned at portions of the first electrode layer EL where the storage electrode STE and the electrode patterns STP will be formed. The etch stop layer pattern 220 may cover the first electrode layer EL in the first and the second peripheral regions PA 1 and PA2 and the intervening area SA. The first electrode layer EL may be formed using a transparent conductive material. For example, the first electrode layer EL may be formed using indium tin oxide or indium zinc oxide, etc.

The first electrode layer EL may be partially etched using the etch stop layer pattern 220 as an etching mask, and then the etch stop layer pattern 220 is removed.

Figure 5B:
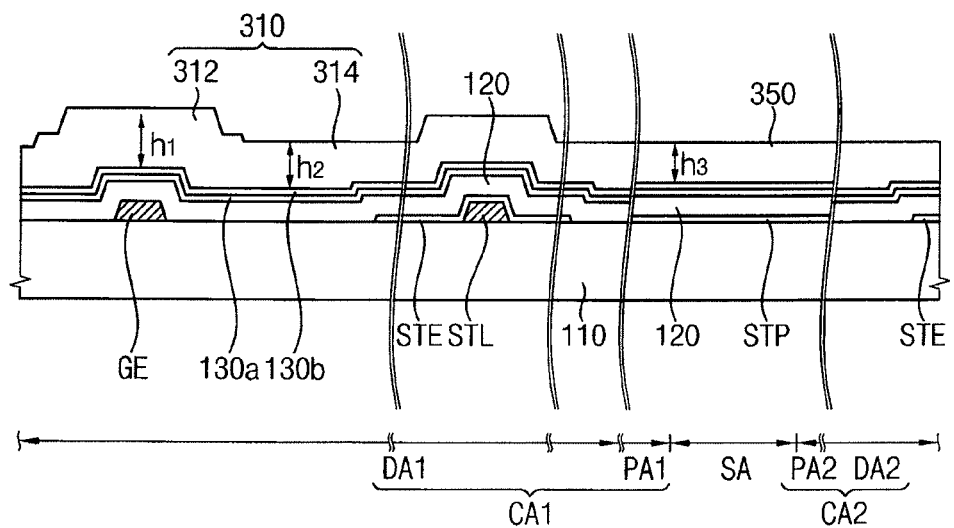

Referring to FIG. 5B, the first electrode layer EL may be patterned to form the storage electrode STE serving as a first electrode and the electrode patterns STP over the base substrate 110. The storage electrode STE may be spaced apart from the gate electrode GE. The storage electrode STE may make direct contact with an upper face of the storage line STL. The electrode patterns STP may be positioned in the first and the second peripheral regions PA1 and PA2 and the intervening area SA.

The first insulation layer 120, a semiconductor layer 130a and an ohmic contact layer 130b may be sequentially formed over the base substrate 110 on which the gate electrode GE, the storage electrode STE and the electrode patterns STP are formed.

A first photoresist pattern 310 and a second photoresist pattern 350 may be formed on the ohmic contact layer 130b. The first photoresist pattern 310 may includes a first portion 312 and a second portion 314. The second photoresist pattern 320 may be located in the first and the second peripheral regions PA1 and PA2 and the intervening area SA. Thicknesses of the first and the second photoresist patterns 310 and 350 may be adjusted by an intensity of light incident onto a second coating layer for forming the first and the second photoresist patterns 310 and 350. The second photoresist pattern 350 may cover the ohmic contact layer 130b in the intervening area SA.

The ohmic contact layer 130b, the semiconductor layer 130a and the first insulation layer 120 may be etched by a first etching process using the first and the second photoresist patterns 310 and 350 as etching masks. Although it is not illustrated, a pad portion connected to a first signal line for applying a gate signal may be formed in the first and the second peripheral regions PA1 and PA2. Here, the ohmic contact layer 130b, the semiconductor layer 130a and the first insulation layer 120 on the pad portion may be removed in the first etching process. Thus, a terminal of the pad portion may be exposed after the first etching process. The terminal of the pad portion may have a construction substantially the same as or substantially similar to that of the gate electrode GE and/or that of the storage line STL. Since the second photoresist pattern 350 may cover the electrode patterns STP, a gas and/or a solution used in the first etching process may not make contact with the electrode patterns STP while performing the first etching process.

Figure 5C:
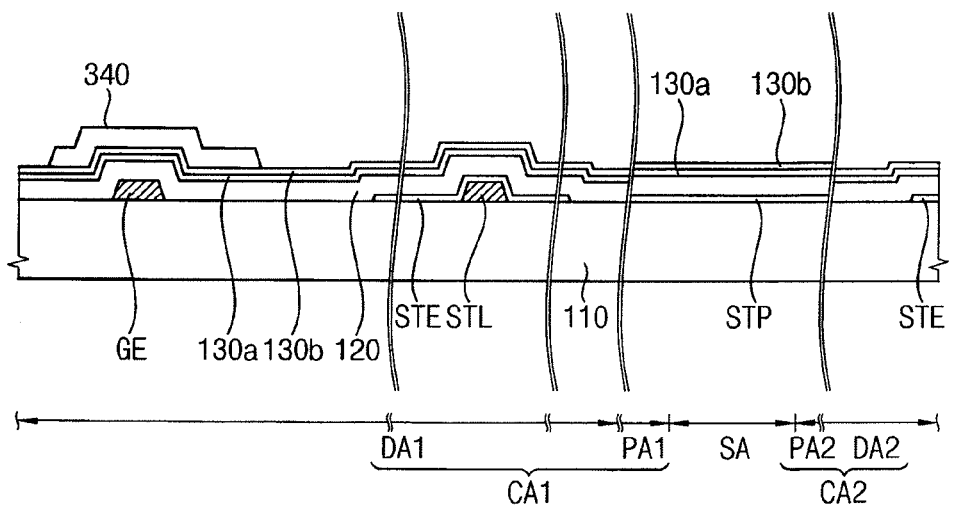

Referring to FIG. 5C, an etch-back process may be performed about the first and the second photoresist patterns 310 and 350 to form a remaining pattern 340 over the gate electrode GE after the first etching process. For example, the second portion 314 and the second photoresist pattern 320 may be removed to obtain the remaining pattern 340.

Figure 5D:
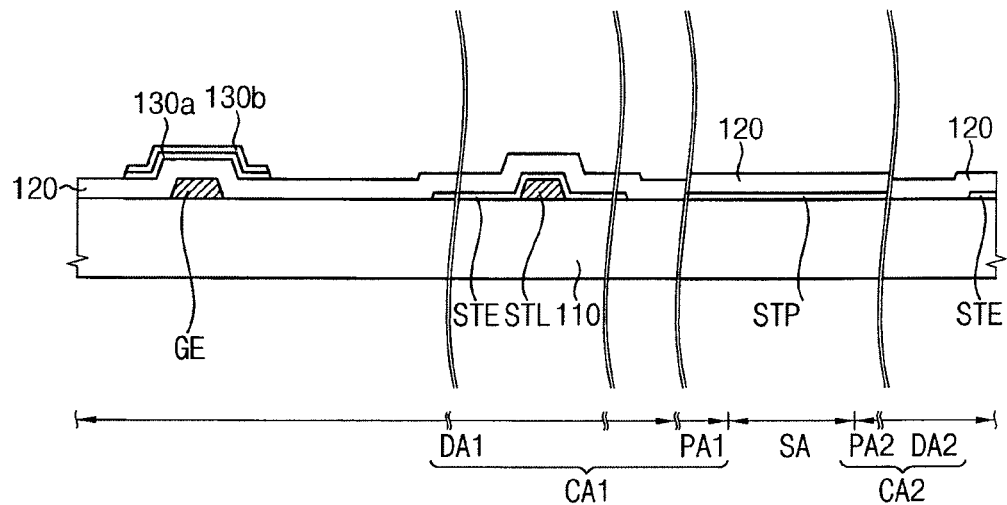

Referring to FIG. 5D, the ohmic contact layer 130b and the semiconductor layer 130a may be partially etched by a second etching process using the remaining pattern 340 as an etching mask. Therefore, an active pattern of the thin film transistor including an ohmic contact pattern 130b and a semiconductor layer 130a may be formed on the first insulation layer 120. Additionally, the first insulation layer 120 positioned under the semiconductor pattern 130a may be exposed.

The remaining pattern 340 may be removed from the active pattern. A cleaning process may be performed about the base substrate 110 from which the remaining pattern 340 is removed.

As described above with references to FIGS. 5B to 5D, the first insulation layer 120, the semiconductor layer 130a and the ohmic contact layer 130b may be patterned using one mask, to thereby form the active pattern and to expose a pad portion (not illustrated) in the first and the second peripheral regions PA1 and PA2. Thus, a manufacturing process of the display substrate may be simplified. Further, the electrode patterns STP may be covered with the first insulation layer 120 layer, contacts of the electrode patterns STP relative to the gases and/or the solutions may be prevented although the intervening area SA may be exposed to the gases and/or the solutions used in the second etching process or a process for removing the remaining pattern 340.

Figure 5E:
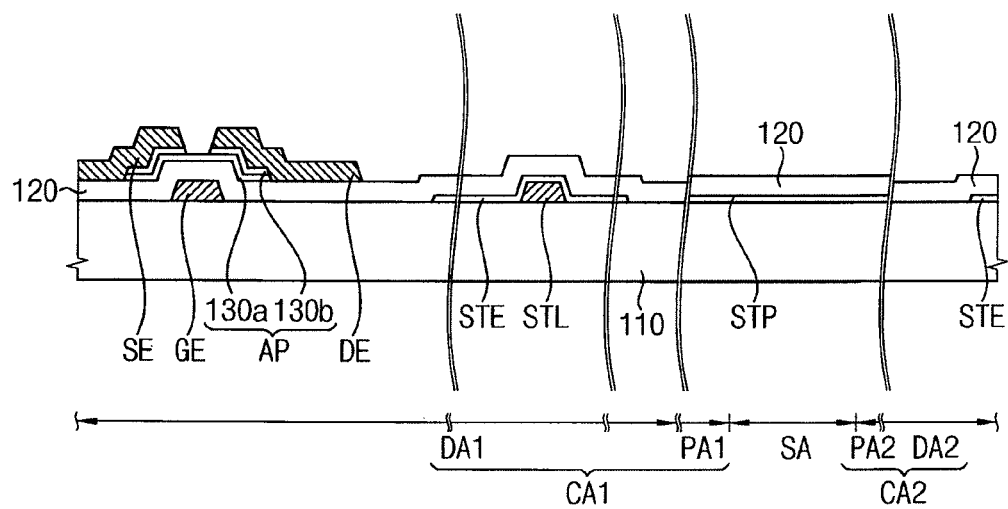
Figure 5F:
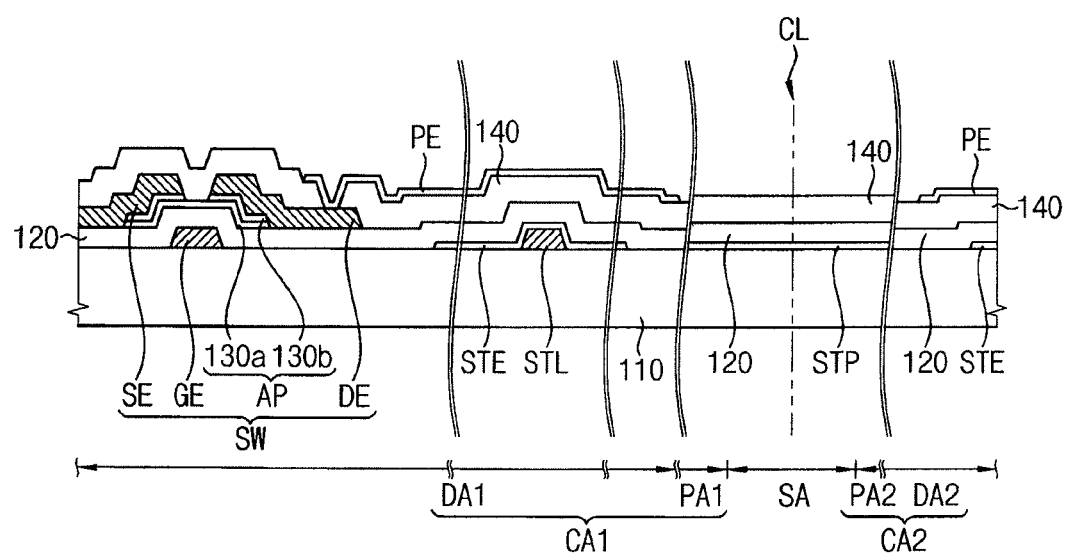

Referring to FIGS. 5E and 5F, the source electrode SE and the drain electrode DE may be formed over the base substrate 110 having the active pattern, and then the second insulation layer 140 having an opening 142 partially exposing an upper face of the drain electrode DE may be formed to cover the source electrode SE and drain electrode DE. A pixel electrode contacting the upper face of the drain electrode DE through the opening 142 may be formed on the second insulation layer 140. The pixel electrode PE may serve as the second electrode, and may partially overlap with the storage electrode STE.

Processes of forming the source electrode SE, the drain electrode DE and the second insulation layer 140 may be substantially the same as or substantially similar to those described with reference to FIGS. 3E and 3F.

As described above, although the electrode pattern STP may be formed in the intervening area SA, the second photoresist pattern 350 may cover the intervening area SA in forming of the active pattern, so that the electrode pattern STP may not be exposed to the gas and/or the solution used in formation of the active pattern. In case that the electrode pattern STP may not be covered with the second photoresist pattern 350, the electrode pattern STP may be damaged by the gas and/or the solution and also the second metal layer for forming the source and the drain electrode SE and DE may be deteriorated because the second metal layer may be formed on the electrode pattern STP. That is, the second photoresist pattern 350 may cover the electrode pattern STP, so that deteriorations of the source electrode SE and the drain electrode DE may be effectively prevented. Therefore, electrical characteristics and a reliability of the mother substrate 102 may be improved and also the reliability of display substrate manufacturing processes may be improved.

Although it is not illustrated, the mother substrate 102 may be cut along a cutting line such as the mother substrate 101 illustrated in FIGS. 1 and 2. By cutting of the mother substrate 102, the first and the second cell areas CA1 and CA2 may be separated to provide display substrates substantially corresponding to the first and the second cell areas CA1 and CA2, respectively.

According to at least one of the disclosed embodiments, an electrode pattern in a peripheral region around a display region of a cell area may have a construction substantially the same as or substantially similar to that of a storage electrode disposed in the display region. This can prevent the electrode pattern from being exposed to gases and/or solutions employed in etching processes for forming thin film transistors, thus avoiding unintended corrosion. Accordingly, TFT electrodes may be formed on a well formed electrode pattern to thereby improving electrical characteristics and reliability of the transistor and overall display.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A method of manufacturing a display substrate, the method comprising:
    forming a gate electrode layer on a base substrate, wherein the base substrate comprises a first cell area, a second cell area and an intervening area interposed between the first and second cell areas, and wherein each of the first and the second cell areas comprises a display region;
    patterning the gate electrode layer so as to form a plurality of first gate electrodes in the display regions of the first and second cell areas;
    removing the gate electrode layer from the intervening area; and
    forming source and drain electrodes in the first and second cell areas where the first gate electrodes are formed, wherein the source electrodes are separated from the drain electrodes.

2. The method of claim 1, further comprising:
    forming a first insulation layer and a semiconductor layer on the base substrate before forming the source and drain electrodes;

at least partially etching the first insulation layer and the semiconductor layer to expose the base substrate in the intervening area; and patterning the semiconductor layer so as to form a plurality of active patterns among the source electrodes, the drain electrodes and the first electrodes, wherein the source and drain electrodes are disposed between the first electrodes and the active patterns, respectively.

3. The method of claim 2, wherein the patterning of the semiconductor layer comprises:

forming a first photoresist pattern on the semiconductor layer in the display regions of the first and second cell areas, wherein the first photoresist pattern comprises a first portion and a second portion having a thickness less than that of the first portion;

forming a second photoresist pattern in a peripheral region surrounding the display region of the first cell area, wherein the second photoresist pattern has a thickness substantially the same as that of the second portion;

forming a third photoresist pattern in a peripheral region surrounding the display region of the second cell area, wherein the third photoresist pattern has a thickness substantially the same as that of the second photoresist pattern and is spaced apart from the second photoresist pattern;

at least partially patterning the first insulation layer and the semiconductor layer via a first etching process which uses the first, second and third photoresist patterns as etching masks;

removing the second portion, and the second and third photoresist patterns to form a remaining pattern; and patterning the semiconductor layer via a second etching process which uses the remaining pattern as an etching mask.

4. The method of claim 3, wherein the semiconductor layer in the intervening area is exposed by the second and third photoresist patterns, and wherein the semiconductor layer and the first insulation layer are at least partially removed to expose the base substrate in the intervening area in the first etching process.

5. The method of claim 3, wherein the semiconductor layer exposed by the remaining pattern is removed to expose the first insulation layer formed in the second etching process.

6. The method of claim 1, further comprising forming a plurality of gate electrodes and storage lines separated from the gate electrodes on the base substrate in the first and second cell areas before forming the electrode layer.

7. The method of claim 6, wherein the first electrodes comprise a plurality of storage electrodes directly contacting the storage lines.

8. The method of claim 1, further comprising forming a plurality of second electrodes which contact the drain electrodes and overlaps with the first electrodes after forming the source and the drain electrodes.

9. The method of claim 8, further comprising:

forming a second insulation layer over the base substrate having the source and drain electrodes before forming the second electrodes; and at least partially etching the second insulation layer to expose the drain electrodes.

10. The method of claim 1, further comprising cutting the base substrate along the intervening area.

11. A method of manufacturing a display substrate, the method comprising:

forming a first gate electrode layer on a base substrate, wherein the base substrate comprises a first cell area, a second cell area and an intervening area interposed between the first and second cell areas and wherein each of the first and the second cell areas comprises a display region;

patterning the first gate electrode layer so as to form a plurality of first electrodes in the display regions of the first and second cell areas;

forming a plurality of gate electrode patterns in the intervening area and in a peripheral region surrounding the display regions of the first and second cell areas;

forming a first insulation layer and a semiconductor layer over the base substrate;

forming a first photoresist pattern on the semiconductor layer in the first and second cell regions, wherein the first photoresist pattern comprises a first portion and a second portion having a thickness less than that of the first portion;

forming a second photoresist pattern in the peripheral region and the intervening area, wherein the second photoresist patter has a thickness substantially the same as that of the second portion;

patterning the first insulation layer and the semiconductor layer, with the use of the first and second photoresist patterns as etching masks, so as to form a plurality of active patters; and forming source and drain electrodes in the first and second cell areas over the base substrate, wherein the drain electrodes are spaced apart from the source electrodes.

12. The method of claim 11, wherein the patterning of the first insulation layer and the semiconductor layer comprises:

at least partially etching the first insulation layer and the semiconductor layer via a first etching process which uses the first and second photoresist patterns as etching masks;

removing the second portion to form a remaining pattern; and at least partially etching the semiconductor layer exposed by the remaining pattern via a second etching process.

13. The method of claim 11, further comprising forming a plurality of gate electrodes and storage lines separated from the gate electrodes over the base substrate before forming the first electrode layer.

14. The method of claim 13, wherein the first electrodes comprise a plurality of storage electrodes directly contacting the storage lines.

15. The method of claim 11, further comprising forming a plurality of second gate electrodes contacting the drain electrodes and overlapping with the first electrodes after forming the source and drain electrodes.

16. The method of claim 15, further comprising:

forming a second insulation layer over the base substrate before forming the plurality of second gate electrodes; and etching the second insulation layer to at least partially expose the drain electrodes.

17. The method of claim 16, further comprising forming a second electrode layer on the second insulation layer.

18. The method of claim 11, further comprising cutting the base substrate along the intervening area.

* * * * *